(12) United States Patent
Mynatt et al.

(10) Patent No.: US 6,755,578 B1
(45) Date of Patent: Jun. 29, 2004

(54) OPTICAL SUBASSEMBLY ENCLOSURE

(75) Inventors: Blake Mynatt, Broomfield, CO (US);
Dennis King, Longmont, CO (US);
Jason Yorks, Longmont, CO (US);
William Kit Dean, Golden, CO (US);
Mark Stiehl, Lafayette, CO (US)

(73) Assignee: Optical Communication Products, Inc., Woodland Hills, CA (US)

( * ) Notice: Subject to any disclaimer, the term of this patent is extended or adjusted under 35 U.S.C. 154(b) by 0 days.

(21) Appl. No.: 10/011,685

(22) Filed: Dec. 4, 2001

Related U.S. Application Data
(60) Provisional application No. 60/254,420, filed on Dec. 8, 2000.

(51) Int. Cl.[7] ................................................ G02B 6/36
(52) U.S. Cl. ............................ 385/92; 385/88; 385/91; 385/94; 385/147
(58) Field of Search ....................... 385/53, 56, 65, 385/83, 88, 91, 92, 94, 147; 73/115, 705, 714–716, 756

(56) References Cited

U.S. PATENT DOCUMENTS

| | | | | |
|---|---|---|---|---|
| 5,011,246 A | * | 4/1991 | Corradetti et al. | 385/92 |
| 5,313,546 A | * | 5/1994 | Toffetti | 385/135 |
| 5,495,364 A | * | 2/1996 | Palmer | 359/412 |
| 5,537,261 A | * | 7/1996 | Palmer | 359/819 |
| 5,727,104 A | * | 3/1998 | Sasaki et al. | 385/92 |
| 5,736,675 A | * | 4/1998 | Michaels | 174/50.5 |
| 6,074,104 A | * | 6/2000 | Higashikawa | 385/94 |
| 6,502,999 B1 | * | 1/2003 | Cohen et al. | 385/94 |
| 2003/0091269 A1 | * | 5/2003 | Wu et al. | 385/18 |

* cited by examiner

Primary Examiner—Akm Enayet Ullah
Assistant Examiner—Daniel Petkovsek
(74) Attorney, Agent, or Firm—Barlow, Josephs & Holmes, Ltd.

(57) ABSTRACT

A housing for optoelectronic devices provides EMI shielding and axial strain suppression for optical fibers coupled to optoelectronic devices retained within the housing. The housing includes an internal septum for EMI shielding and a grounding scheme including relief features of the conductive housing coupled to internal grounding strips. The housing provides a first exemplary engaging/locking feature including an orthogonal tongue and a groove that receives the tongue, and a second exemplary engaging/locking feature that includes a groove having an intermittently varying cross-sectional area and that retains a gasket of constant cross-sectional area. Arms extend from tho housing and retain an optical fiber that is secured to the arm by an adhesive such that axial strain is not exerted at the point of optical coupling and a high optical coupling efficiency is maintained. In an exemplary embodiment, the housing includes an opening through a bottom surface, the opening bounded by beveled edges to aid in blind alignment of the housing over components formed on a mounting surface. The bottom of the housing includes a recessed portion that retains a gasket. The recessed portion receives a gasket of constant thickness and includes a gap of varying thickness that provides for sufficient compression throughout the gasket and a tight, EMI-shielding seal formed between the housing and the mounting surface.

7 Claims, 18 Drawing Sheets

UPPER PORTION

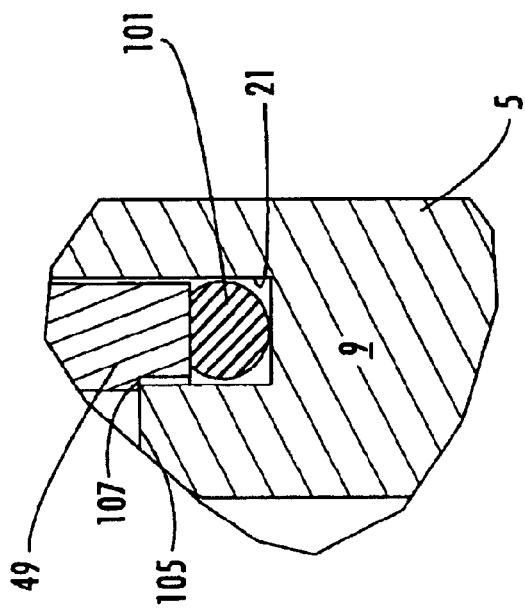
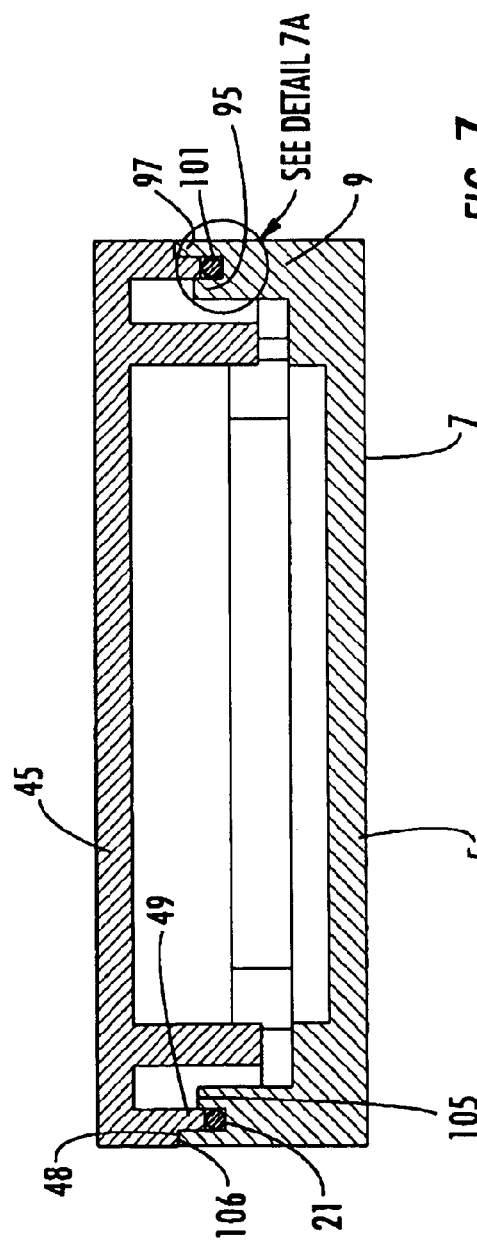
FIG. 7A
FIG. 7

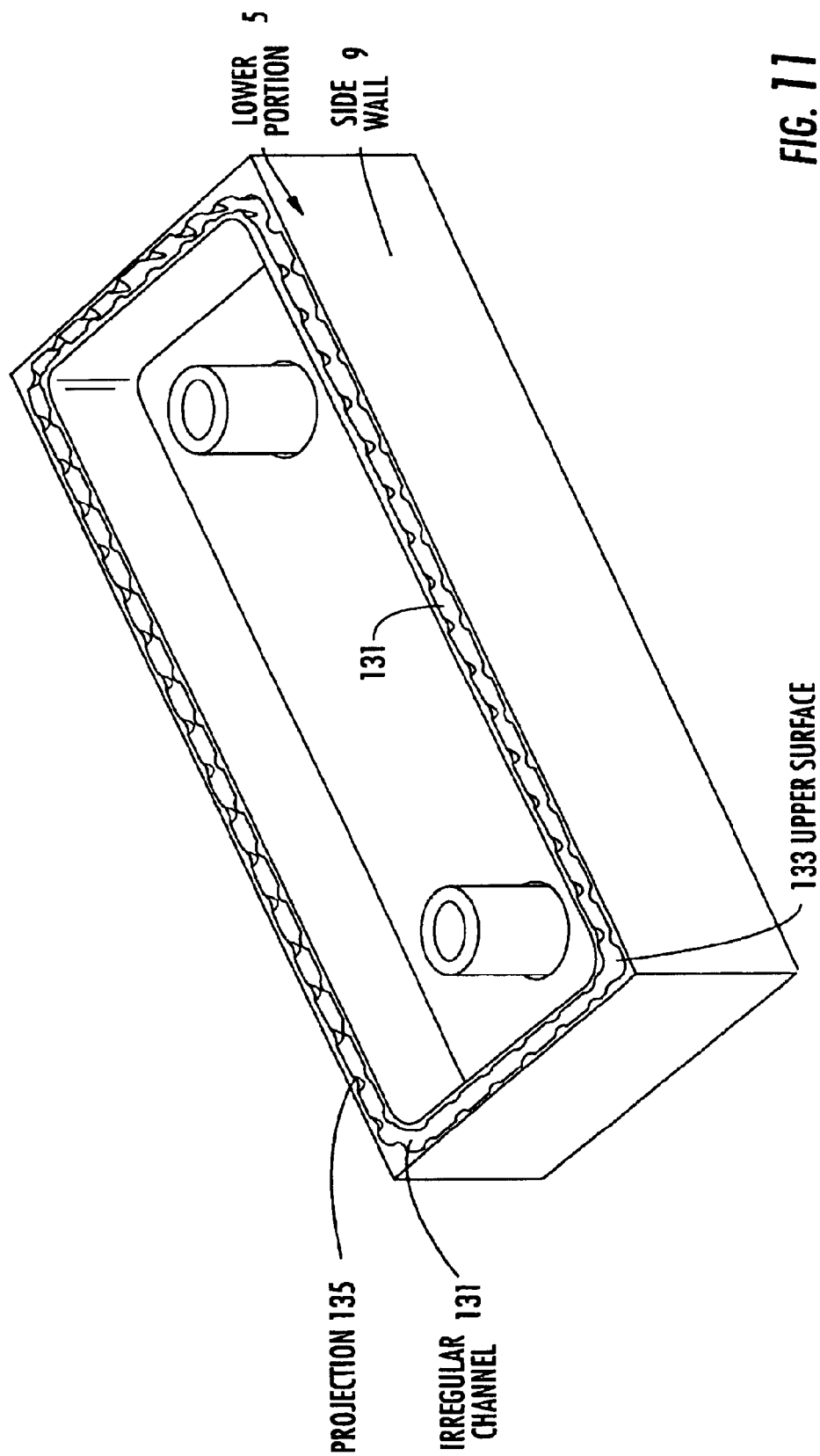

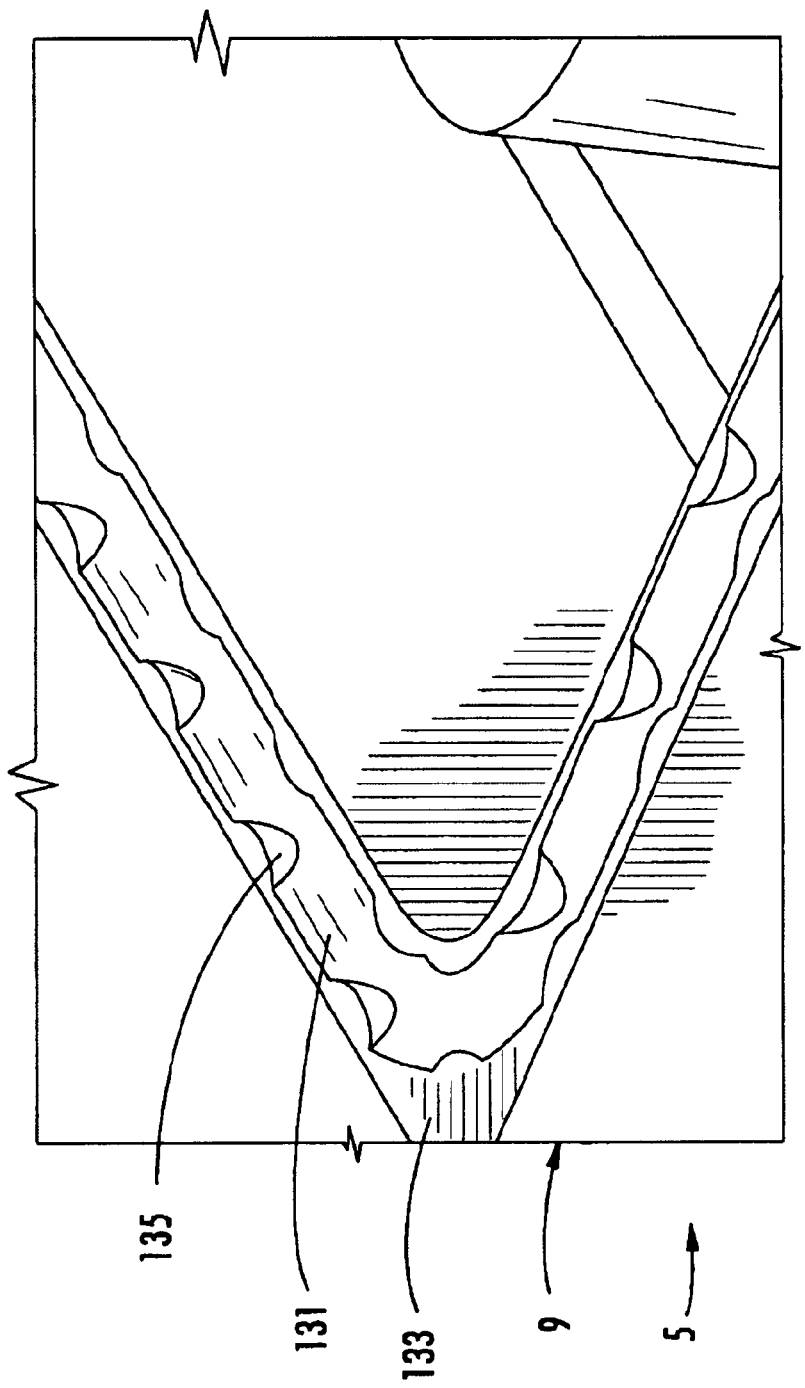

OPTICAL SUBASSEMBLY ENCLOSURE

CROSS-REFERENCE TO RELATED APPLICATION

This application claims priority of U.S. application Ser. No. 60/254,420, entitled "Optical Subassembly Enclosure", filed on Dec. 8, 2000, the contents of which are hereby incorporated by reference.

FIELD OF THE INVENTION

The present invention relates, most generally, to optoelectronic telecommunications systems. More particularly, the present invention relates to an enclosure for housing optical subassemblies and associated components.

BACKGROUND OF THE INVENTION

Optoelectronic devices such as vertical cavity surface emitting lasers (VCSELs) and other lasers, photodiodes and other photodetectors, have become widely used in the telecommunications and other industries. In optoelectronic devices, an electrical signal is converted to an optical signal that travels along a transmission medium such as an optical fiber and is then typically converted back to an electrical signal. A high optical coupling efficiency ensures good optoelectronic connections. The electrical-to-optical optoelectronic connections are typically made in optical subassemblies (OSAs) such as TOSAs (transmission OSAs) and ROSAs (receiving OSAs). The optoelectronic devices and the connection of the optical transmission media to the optoelectronic devices are typically delicate, and therefore an OSA having stable mechanical support as well as a high quality optical connection, helps ensure a high optical coupling efficiency.

The optoelectronic devices commonly used in today's telecommunication industry typically operate at high frequencies such as 2.5–10 GBPS (gigabits per second) and higher. Therefore, when an OSA and the associated high frequency components are joined to a customer board or other mother board which contains low frequency components, it is desirable to suppress EMI (electromagnetic interference) noise from adversely affecting other portions of the module circuitry such as circuitry operating at other frequencies. Optoelectronic devices, and the various OSAs which contain them, are typically included in an enclosure or housing that contains various other electronic components and is joined to the customer board or other mother board. The housing may be configured to be mounted over further electronic components mounted on the customer board.

SUMMARY OF THE INVENTION

The present invention provides a housing for housing optoelectronic components such as TOSAs and ROSAs, printed circuit boards, and the like. The housing is suitable for various optoelectronic devices. In one exemplary embodiment, the housing is a multiple-piece housing which, according to one exemplary embodiment of the invention, includes an internal septum that suppresses high frequency noise such as EMI and RFI from traveling between the chambers of the housing.

According to another embodiment of the invention, the housing includes a peripheral engaging feature including a groove, a gasket, and a tongue that is received within the groove and compresses the gasket. The peripheral engaging feature may be used to suppress high frequency noise such as EMI and RFI. According to another exemplary embodiment, the present invention provides a channel having a cross-sectional area that varies intermittently along the longitudinal direction. The corrugated channel retains a gasket and allows for an improved and continuously tight seal to be formed between the components which combine to form the multiple-piece housing.

According to another exemplary embodiment, the housing of the present invention includes an opening through its bottom surface. The housing is mounted on a mounting surface such that components formed on the mounting surface are nested within the housing. The bottom of the housing includes a recessed portion having a bowed surface and a gasket received within the recessed portion. The gasket combines with the bowed recessed portion to form a tight seal between the housing and the mounting surface. The tight seal is capable of suppressing EMI and RFI noise.

According to another exemplary embodiment, the housing of the present invention includes internal grounding leads which contact relief features of the conductive housing and direct internal errant signals to the internal grounding strips and eventually the intended ground path.

According to another exemplary embodiment, the present invention includes an opaque housing having an internal portion and an external portion and a bottom surface having an opening therethrough. The opening through the bottom is bounded by beveled edges that aid in the blind alignment of the housing over components formed on the mounting surface.

According to yet another exemplary embodiment, the housing further includes means for alleviating axial strain on optical fibers extending from the housing and optically coupled to optoelectronic devices within the housing. The present invention provides arms that extend from the housing and retain optical fibers. The optical fiber is joined to the arm by means of an adhesive. Axial strain at the optical connection is alleviated because the optical fiber is affixed to the housing at a point external to the optical connection, and therefore no strain is exerted at the optical coupling point and the optical coupling efficiency is not compromised. A pocket formed in the arm of the enclosure contains the adhesive which bonds the optical fiber to the enclosure arm.

BRIEF DESCRIPTION OF THE DRAWINGS

The present invention is best understood from the following detailed description, when read in conjunction with the accompanying drawings. It is emphasized that, according to common practice, the various features of the drawings are not to scale. On the contrary, the dimensions of the various features are arbitrarily expanded or reduced for clarity and to emphasize features of the present invention. Like numerals refer to like feature throughout the specification and drawings. Included are the following figures:

FIG. 7 is a cross-sectional view of an exemplary peripheral engaging/locking feature of the present invention;

FIG. 7A is an expanded cross-sectional view of the peripheral engaging/locking feature shown in FIG. 7;

FIG. 11 is a perspective view of a corrugated channel of an exemplary engaging feature of the present invention;

FIG. 12 is an expanded perspective view of the corrugated channel of the engaging feature of the present invention;

DETAILED DESCRIPTION OF THE INVENTION

The present invention provides an enclosure for housing optoelectronic components. The enclosure may alternatively be referred to as a housing and may be produced by machining, or it may be die cast.

Figure 1:
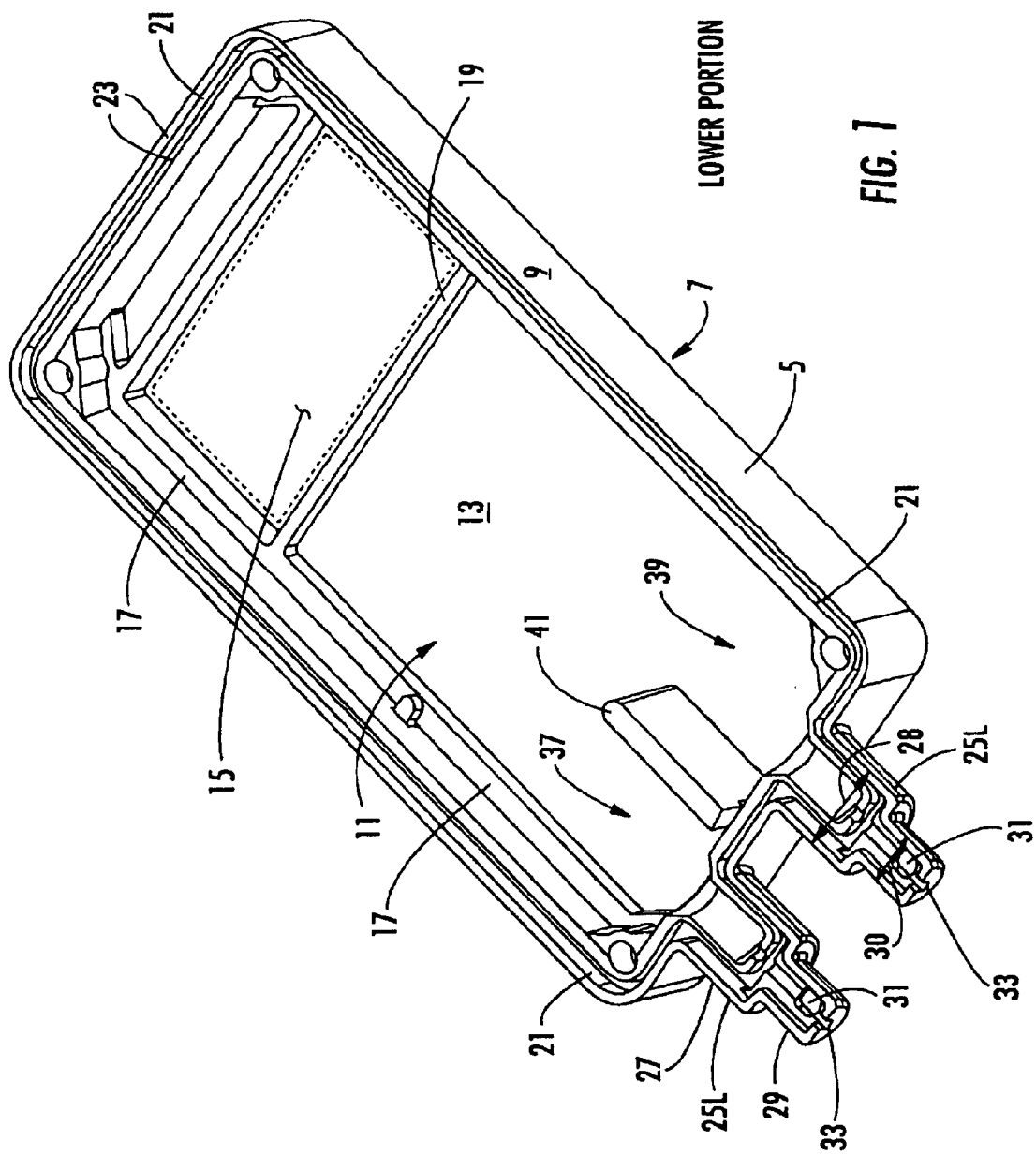
FIG. 1 is a perspective view showing an exemplary lower portion of the optoelectronic housing of the present invention.
Figure 2:
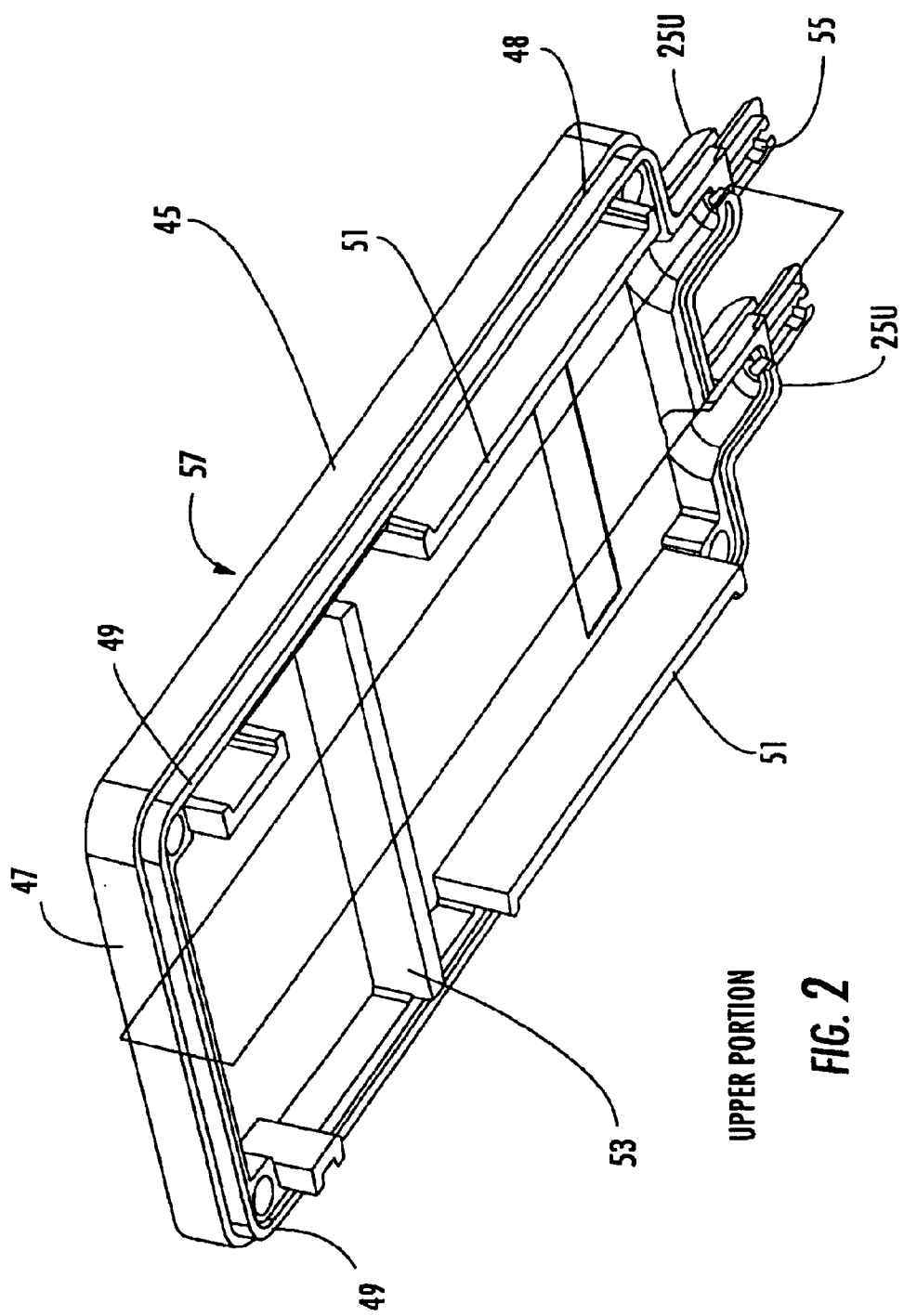
FIG. 2 is a perspective view showing an exemplary upper portion of the optoelectronic housing of the present invention.

According to an exemplary embodiment, the housing may be a two-piece enclosure including a lower portion such as shown in FIG. 1 and an upper portion such as shown in FIG. 2. The housing is designed to be mounted on a customer board or other mother board. The housing includes various optoelectronic devices retained internally. Multiple OSAs may be included within the housing. According to an exemplary embodiment, the housing may include both a TOSA and ROSA. The TOSA and ROSA may advantageously be mounted upon a printed circuit board (PCB) sized to fit securely within the housing. In one embodiment, the TOSA and ROSA may be shielded from another to minimize cross-talk. The OSAs may included VCSELs (vertical cavity surface emitting lasers) or other lasers configured to emit light generally along a direction parallel to the printed circuit board and the external board on which the housing is mounted. The OSAs include the optical connection between the optoelectronic device and an optical fiber that may extend out of the housing through an arm. In an exemplary embodiment, the arms extend from the sides of the housing and generally parallel to the external mounting board on which the housing is mounted. The internal printed circuit board may include electronic components mounted on each of its upper and lower surfaces. The bottom of the housing may include an opening through which internal components are coupled to traces and other electronic components included on the customer board on which the housing is mounted. The opening in the bottom of the housing may also enable the housing to be mounted on the mounting board and over electronic components formed on the mounting surface such that the electronic components are covered and essentially internal to the housing. Components formed on the bottom of the internal PCB may be positioned within the opening. In another exemplary embodiment, an internal printed circuit board may not be used and the internal components may be secured within the housing using other media.

The upper and lower portions that combine to form the housing may each be formed of aluminum, zinc or conventional alloys such as aluminum alloys, zinc alloys and other suitable alloys or conductive materials. For example, Zamac No. 3, which is a zinc alloy, or aluminum 383, may be used. The housing is sized and shaped in accordance with the components which it will house and in accordance with its application. Generally speaking, when OSAs including high frequency devices are used, the associated high frequency components used to power and monitor the high frequency optoelectronic devices, are located in close proximity to the high frequency optoelectronic devices in order to minimize the length of the connection and maintain a controlled impedance. These high frequency components are shielded, for example from other components to prevent high frequency noise such as EM waves from degrading the performance of the other components. The low frequency components located within and external to the housing must be shielded from noise such as EMI and RFI noise. Furthermore, errant signals within the housing may be grounded to avoid degrading the performance of the various components in and near the housing. The pieces that combine to form the housing may be tightly sealed and the housing is joined to the mounting board with an advantageously tight seal to suppress EM waves from propagating through the interface formed between the portions that combine to form the housing or between the housing and the mounting board.

According to one exemplary embodiment, the present invention provides an internal septum that suppresses noise from escaping the internal chamber in which it is produced and also suppresses external noise from entering the chamber. According to another embodiment of this invention, the suppression of high frequency noise and cross-talk is achieved by a novel engaging/locking mechanism disposed peripherally around the housing. According to still another aspect of the present invention, a corrugated channel having a varying cross-sectional area is used to retain a gasket and enables a tight seal to be formed between opposed sealing surfaces of the respective portions that combine to form the multiple-piece housing. According to yet another aspect of the present invention, a grounding scheme is provided to direct errant signals through the conductive housing and to an internal ground. Another aspect of this exemplary embodiment is a tight seal formed between the bottom of the housing and the mounting surface. This tight seal prevents the loss of EM waves from components formed on the mounting surface, that extend within an opening through the bottom of the housing. According to still another aspect of this embodiment, axial strain upon the optical fiber is relieved and a high optical coupling efficiency is achieved. This embodiment also provides for the blind alignment of the opaque housing over optical components due to beveled edges formed around an aperture extending through the bottom of the housing.

Now turning to the figures, FIG. 1 is a perspective view showing an exemplary lower portion of an exemplary optoelectronic housing of the present invention. According to the exemplary embodiment, lower portion 5 combines with upper portion 45 shown in FIG. 2 to form an exemplary two-piece enclosure or housing of the present invention. According to other exemplary embodiments, more than two portions may be combined to form the housing. Lower portion 5 includes bottom 7 and sidewalls 9. Sidewalls 9 define interior 11. Interior 11 includes bottom surface 13 in one area and aperture 15 extends through bottom 7 of lower portion 5 in another area. Lower portion 5 also includes ribs 17 and 19. Within sidewall 9 and extending peripherally about lower portion 5, groove 21 extends downward from upper surface 23 of sidewall 9. Each of bottom 7 and bottom surface 13 are generally flat. Internal ribs 17 and 19 provide a base upon which an integral printed circuit board or other component-containing member may rest. According to an exemplary embodiment, a printed circuit board (not shown) extends over aperture 15 where components such as connectors which may be formed on the underside of the printed circuit board, may be coupled to external components.

According to one exemplary embodiment, a pair of OSAs may be mounted within the housing such as on a printed circuit board at approximately locations 37 and 39. In an exemplary embodiment in which the two OSAs are a TOSA and ROSA, partition 41 is provided to minimize cross-talk between the transmit and receive optical subassemblies. According to other exemplary embodiments, partition 41 may not be needed or partitions of other suitable shapes may be used. According to an exemplary embodiment, the housing may include one or more arms that extend from the sides of the housing and are capable of retaining an optical fiber having a fiber launch direction being generally parallel to bottom surface 13 and also generally parallel to the mounting surface on which bottom 7 is advantageously mounted. In this manner, the optical fibers are retained for coupling to an optoelectronic device configured to transmit or receive light along a direction generally orthogonal to bottom surface 13 and bottom 7. In an exemplary embodiment, the arms are generally cylindrical and shaped to guide an optical fiber, internally connected to an OSA mounted in interior 11, out of the housing. In an exemplary embodiment, each arm is formed of sections of more than one portion that combine to form the multiple-piece housing of the present invention. As such, FIG. 1 shows a duality of lower arm portions 25L. Each of lower arm portions 25L combines with a corresponding upper portion to form a generally cylindrical arm that encircles and axially retains an optical fiber in an exemplary embodiment. Each exemplary arm includes proximate portion 27 and distal portion 29. Proximate portion includes width 28, which is greater than width 30 of distal portion 29. Lower arm portion 25L includes recess 31 and axial opening 33, which extends concentrically through the arms, in one exemplary embodiment. Other, non-cylindrical arm configurations may be used alternatively. Moreover, according to other exemplary embodiments, opening 33 may extend non-concentrically through the arms.

FIG. 2 is a perspective view showing upper portion 45 of an exemplary housing of the present invention. Upper portion 45 may be joined to lower portion 5 shown in FIG. 1, to form an exemplary housing. Upper portion 45 includes sidewalls 47 and top 57. Sidewalls 47 include tongue 49 which extends below surface 48 which may be a sealing surface joined to a surface of the lower housing portion when the upper and lower portions are engaged, in an exemplary embodiment. Upper portion 45 includes ribs 51 and septum 53. Upper arm portions 25U include recesses 55. According to an exemplary embodiment, when upper and lower portions are joined to form the optical housing of the present invention, septum 53 may provide EMI shielding and rib 51 may contact a grounding strip to direct errant EM waves to ground. Tongue 49 may be received within a corresponding groove formed within the lower portion, such as groove 21 shown in FIG. 1.

Axial Strain Suppression

Figure 3:
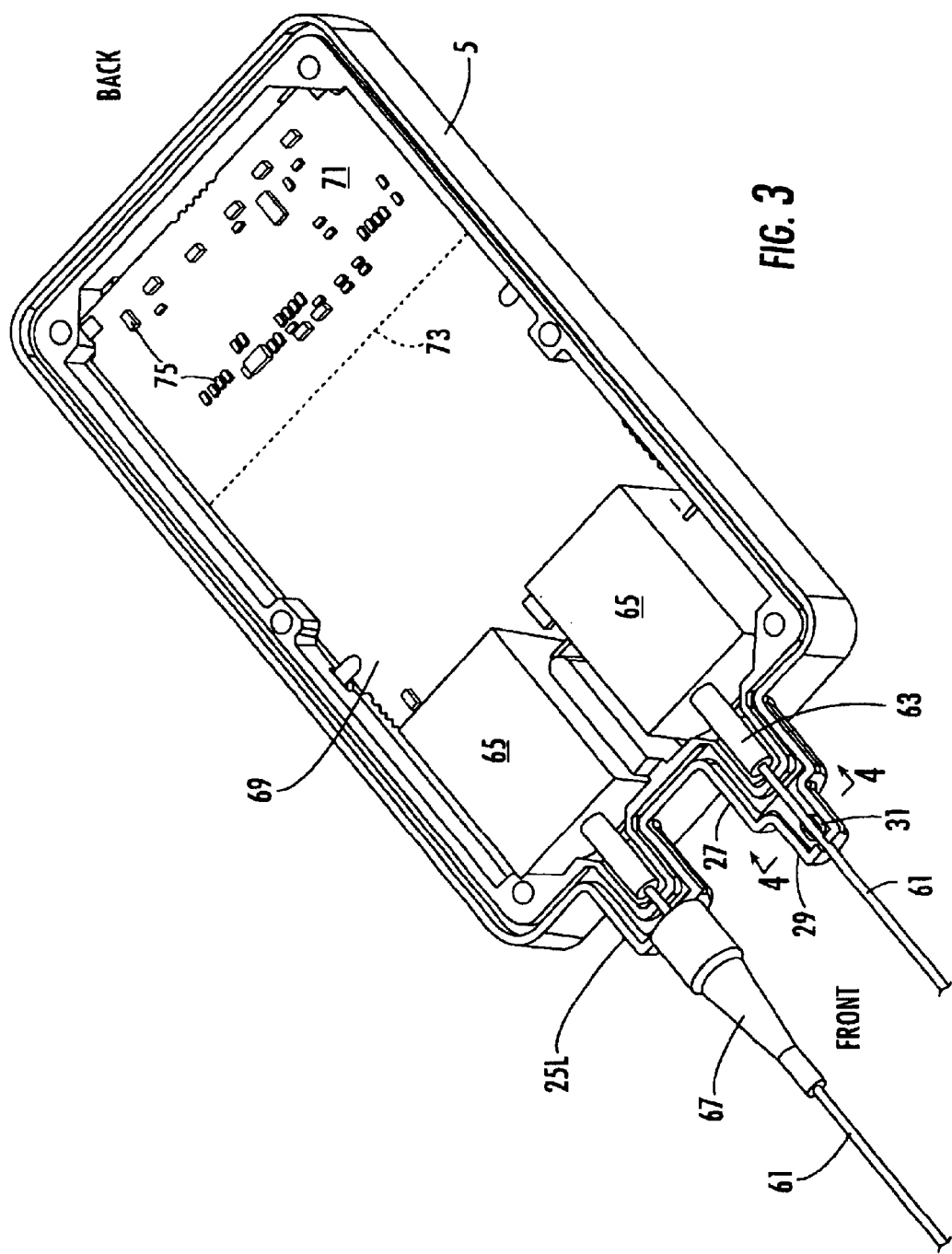
FIG. 3 is a perspective view of the lower portion of the optoelectronic housing including internal components and showing OSAs coupled to optical fibers.

One aspect of the present invention is the suppression of axial strain that may be externally exerted upon an optical fiber. FIG. 3 shows OSAs 65 which each include an internal optoelectronic device and secure a respective optical fiber 61. Optical fiber 61 is terminally encased within ferrule 63 which extends into OSA 65. Ferrule 63 and optical fiber 61 may include co-planar ends or their respective ends may be in close proximity to one another. OSAs 65 may include various configurations for coupling an optical fiber to an optoelectronic device according to the various exemplary embodiments. In one exemplary embodiment, OSAs 65 may include a barrel shaped receptacle for retaining ferrule 63 and optical fiber 61. Within OSA 65, optical fiber 61 is secured and optically coupled to an optoelectronic device included within OSA 65. The end of optical fiber 61 may contact the optoelectronic device within OSA 65 or it may be spaced from the optoelectronic device within OSA 65. According to either of the foregoing exemplary embodiments, the optical coupling arrangement may be a delicate and precise arrangement and the correct positioning of the optical plane of the end of the optical fiber 61 is helpful to ensure high optical coupling efficiency. Ferrule 63 may optionally be affixed to OSA 65 by various conventional means.

Optical fiber 61 is tightly encased within a jacket that extends along the length of the fiber. The jacket provides mechanical support and protects the fiber. If axial strain is asserted upon optical fiber 61 in an outward direction, the quality of the mechanical connection to the optoelectronic device within OSA 65 will be compromised and the optical coupling efficiency will be diminished. Optical fiber 61 may extend for several hundred meters and, as such, there is a considerable likelihood that outward axial strain may be exerted upon optical fiber 61. The fiber launch direction is generally parallel to the mounting surface upon which lower portion 5 is mounted, increasing the likelihood of axial strain being exerted. Optical fiber 61 extends through exemplary axial opening 33 formed within the arm. Recess 31 formed internal to lower arm portion 25L, partially engulfs optical fiber 61. Lower arm portion 25L is an integral projection of lower portion 5 and is a continuous portion thereof. The arm formed when lower arm portion 25L is joined to upper arm portion 25U, is configured to retain portions of ferrule 63 within wider proximate portion 27 of the arm and optical fiber 61 in the narrower distal portion 29 of the arm. Recess or pocket 31 is formed within distal portion 29.

Strain relief is achieved by including an adhesive such as a conventional epoxy in recess 31, then placing optical fiber 61 into position. The epoxy may be a conventional UV-curable epoxy or other suitable epoxies. According to one exemplary embodiment, Locktite 352 may be used. Other suitable adhesives may be used alternatively. According to one exemplary embodiment, a drop of adhesive is introduced into recess 31, then optical fiber 61 may be aligned into position by means of conical alignment member 67 or by placing upper arm portion 25U shown in FIG. 2, into position over corresponding lower arm portion 25L of lower portion 5 to form the housing. A volume of adhesive may be added such that the adhesive at least partially (and maybe completely) surrounds optical fiber 61 when optical fiber 61 is in position within the completed arm formed of lower arm portion 25L and upper arm portion 25U. Optical fiber 61 is therefore directly secured to the arm at a point past ferrule 63, relative to the housing.

Figure 4:
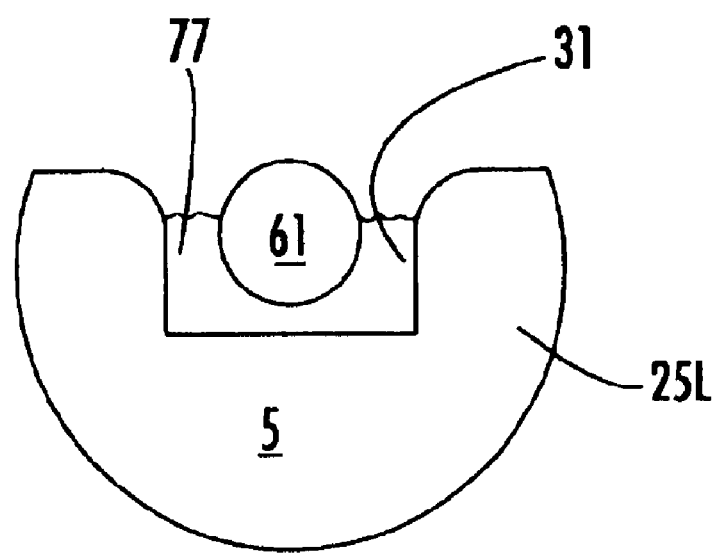
FIG. 4 is a cross-sectional view showing an optical fiber secured to a pocket formed in an arm portion of the optoelectronic housing of the present invention.

FIG. 4 is a cross-sectional view taken along line 4—4 of FIG. 3 and shows optical fiber 61 secured into an exemplary position. Referring to FIG. 4, adhesive 77 is added within pocket or recess 31 of lower arm portion 25L of the housing and then optical fiber 31 is placed into position as above. The adhesive may then be cured or otherwise solidified. According to this exemplary embodiment, upper arm portion 25U may be secured over lower arm portion 25L without adding any further adhesive.

Figure 5:
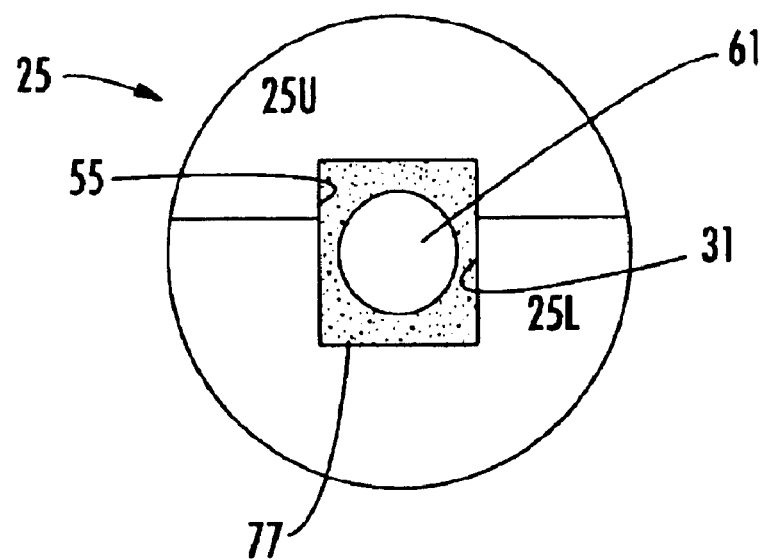
FIG. 5 is a cross-sectional view showing an optical fiber secured to a complete arm of the optoelectronic housing of the present invention.

According to another exemplary embodiment such as shown in FIG. 5, adhesive 77 may circumferentially surround optical fiber 61 and may further extend within a corresponding recess 55 formed in top portion 45 and opposite recess 31 formed in lower arm portion 25L. Although the shape of the recess shown in the cross-sectional representation of the combination of lower arm portion 25L and upper arm portion 25U is essentially rectangular, such is intended to be exemplary only and the recesses may take on other configurations in other exemplary embodiments. After the arrangement such as shown in FIGS. 4 and 5 is formed, the adhesive may be treated or allowed to solidify to secure optical fiber 61 into position. In the exemplary embodiment in which adhesive 77 is an epoxy, the epoxy may be cured by UV-curing, temperature curing, or other curing means to secure optical fiber 61 into position. The curing process may take place before or after upper arm portion 25U is placed into position as shown in FIG. 5.

Now returning to FIG. 3, it can be seen that any axial strain exerted upon optical fiber 61 is not transferred to the point where optical fiber 61 is coupled to the optoelectronic device secured within OSA 65. In this manner, the optical coupling efficiency may be increased by not allowing the strain to propagate through to the ferrule 63.

Recesses 31 and 55 may be formed by machining or they may be formed as part of the die cast. The generally cylindrical shape of the arms and the generally axial positioning of optical fiber 61 within the arms formed of upper and lower arm portions 25U and 25L, respectively, is intended to be exemplary only. The arms are generally configured to retain an optical fiber therein, the optical fiber generally extending substantially parallel to the top and bottom surfaces of the housing. Other arm shapes may be used in other exemplary embodiments.

FIG. 3 also shows printed circuit board (PCB) 69 positioned within internal portion 11 of lower portion 5. PCB 69 includes top surface 71 and extends over bottom surface 13 and aperture 15 such as shown in FIG. 1. Various exemplary components 75 are formed on top surface 71 of PCB 69. Dashed line 73 generally represents the location along which exemplary septum 53 of upper portion 45 (shown in FIG. 2) will be positioned.

Internal Septum for Noise Suppression

According to another exemplary embodiment of the present invention, an internal septum and gasket combination shields internal high frequencies from escaping from the localized compartment in which the active high frequency generating components are included. An exemplary internal septum is shown as septum 53 shown in FIG. 2. Septum 53 is integrally formed as part of upper portion 45 and extends substantially vertically from top 57 of upper portion 45. When upper portion 45 is engaged with lower portion 5 shown in FIG. 1 to form an exemplary housing of the present invention, septum 53 extends laterally across the enclosure, just forward of aperture 15 shown in FIG. 1 and functions as an internal septum, separating a first section of the internal chamber from a second section of the internal chamber. Septum 53 may alternatively be described as an internal wall that forms a septum in combination with a gasket, as will be shown in FIG. 6.

Referring again to FIG. 3, it can be seen that various components 75 are formed on printed circuit board 69 which is seated within lower portion 5 and extends from front to back according to the arbitrary spatial designation assigned in FIG. 3. Septum 53, shown in FIG. 2, generally extends along dashed line 73 shown in FIG. 3 when top portion 45 shown in FIG. 2 is secured in position over lower portion 5 shown in FIG. 1. According to an exemplary embodiment, components on printed circuit board 69 that are forward of dashed line 73, such as OSAs 65, may be high frequency components. Meanwhile, components such as components 75 that are rearward of dashed line 73 may operate at other, lower frequencies. Beneath these lower frequency components, additional low speed components may be included on the underside and beneath printed circuit board 69. Similarly, additional low frequency components may be included external to the housing and may be coupled to internal components such as through aperture 15 shown in FIG. 1. Septum 53 is therefore positioned to prevent the escape of high frequency EMI noise from the internal chamber portion in which the high frequency components are housed, such as forward of dashed line 73. According to other exemplary embodiments, septum 53 may separate two substantially internal chambers from one another, such as a TOSA-containing chamber from a ROSA-containing chamber. In an exemplary embodiment, the TOSA may include a VCSEL or other optical source and the ROSA may include a photodiode or other exemplary photodetectors. Septum 53 may be generally formed to shield components of one chamber of the housing from other components, and vice versa, regardless of the operating frequencies and functions of the components.

Still referring to FIG. 3, when the upper and lower portions are engaged with exemplary printed circuit board 69 in place, septum 53 is sized so that it nearly forms an interface with upper surface 71 of printed circuit board 69. The gap which would otherwise form between the lower surface of septum 53 and upper surface 71 of printed circuit board 10 is filled by a resilient member such as gasket 79 shown in FIG. 6.

Figure 6:
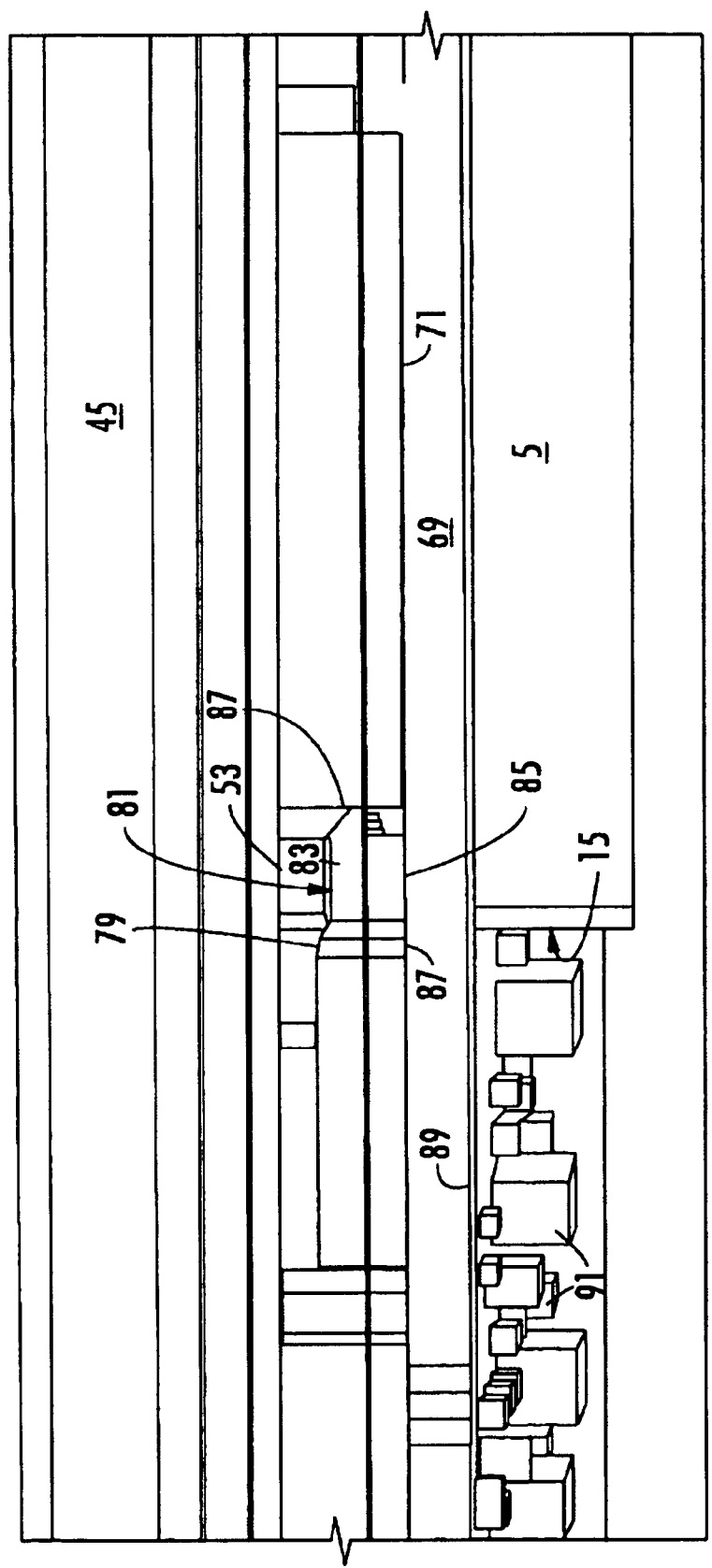
FIG. 6 is a cut-away perspective view showing internal sections of an assembled optoelectronic housing of the present invention.

FIG. 6 is a cutaway view taken longitudinally through an exemplary assembled housing including upper portion 45 joined to lower portion 5. Printed circuit board 69 includes upper surface 71 and bottom surface 89. Components 91 formed on bottom surface 89 extend within aperture 15 of lower portion 5. Septum 53 extends downward from top section 45. Together with gasket 79, septum 53 forms a shield that shields EMI from the left side of the septum 53/gasket 79 configuration, from components on the right side thereof, and vice-versa. Septum 53 extends completely across the enclosure and the gap that otherwise would exist between bottom 83 of septum 53 and surface 71 of PCB 69 is filled by gasket 79. Gasket 79 is formed of an insulating material such as a conventional resilient elastomer material or other suitable materials. Lower surface 85 of gasket 79 is formed of this insulating elastomer. The other surfaces of gasket 79 are formed of conductive material 87, which may be gold plated brass according to an exemplary embodiment. Other suitable conductive materials may be used alternatively. Upper surface 81 of gasket 79 covered with conductive material 87, contacts bottom 83 of septum 53. Insulating lower surface 85 of gasket 79 forms an interface with upper surface 71 to prevent electrical shorting between conductive traces formed on upper surface 71. Gasket 79 contains conductive material 87 on its sides to form a continuous and impenetrable signal barrier in conjunction with septum 53 which it contacts. In an exemplary embodiment, gasket 79 may include a D-shaped or semicircular cross-section with the flat section oriented downward and contacting upper surface 71. In this manner, a metallic signal barrier may be formed continuously from upper surface 71 to the top of upper portion 45 by means of the septum 53/gasket 79 combination. According to this arrangement, noise such as EMI produced by the active component circuitry is reduced or suppressed from leaving the localized area of the chamber portion in which it is generated. Such EMI noise may be directed along septum 53 and/or conductive material 87 to a ground path, which may be internal to said housing.

The positioning and configuration of the septum Is intended to be exemplary only. Various other arrangements may be used to shield high frequency components from other components and the septum may be shaped and positioned differentiy depending on the location of the various components in order to optimally suppress transmission of the energy generated by the active circuitry, or to preclude external interference from affecting the module generators. According to one exemplary embodiment, the septum/gasket configuration may be formed to divide a chamber portion containing a ROSA from another chamber portion containing a TOSA.

Engaging/Locking Feature for Noise Suppression

According to another aspect of the present invention, an engaging/locking mechanism extends peripherally around the housing to provide a tight seal between the portions of the housing and suppress noise produced by high frequency signals such as internally generated EMI radiation and RFI noise produced external to the housing. Aspects of the engaging/locking mechanism are described in conjunction with FIGS. 1, 2, 7, 7A and 8. FIG. 1 shows exemplary groove 21 extending peripherally around lower portion 5 and FIG. 2 shows corresponding tongue 49 extending peripherally around upper portion 45. Tongue 49 is received within groove 21 when the upper and lower portions are engaged. Groove 21 has a generally rectangular cross-section and may alternatively be referred to as a channel. In one exemplary embodiment, a gasket is included within groove 21 and beneath tongue 49 when the upper and lower portions are engaged.

FIG. 7 shows a representative cross-section of an exemplary engaging/locking mechanism of the present invention. Tongue 49 extends down from upper portion 45 and is received within groove 21 formed within sidewall 9 of lower portion 5. Tongue 49 is generally orthogonal and includes a series of 90° bends. Tongue 49 extends orthogonally from upper surface 48, which essentially forms a ledge. As discussed previously, both tongue 49 and groove 21 may each extend peripherally around the housing to mate with each other. Other arrangements may be used alternatively. Gasket 101 is placed within groove 21 and may be a continuous member sized to extend completely within groove 21. Gasket 101 may be a conventional gasket chosen to have appropriate shielding effectiveness to shield high frequencies. According to an exemplary embodiment, gasket 101 may be formed of an elastomer, for example, it may be an EMI gasket including silver plated copper impregnated in a silicon elastomer, but other suitable materials may be used alternatively. According to various exemplary embodiments, gasket 101 may be an elastomeric gasket either impregnated, coated or otherwise encased in an electrically conductive material. Groove 21 extends downward in sidewall 9 and is bounded by sides 95 and 97 which are of different height. Sides 95 and 97 include top surfaces 105 and 106, respectively. Outer side 97 includes upper surface 106 that contacts upper surface 48 of top portion 45 when the upper and lower portions of the housing are engaged. In an exemplary embodiment, upper surface or ledge 48 forms a contermninous boundary with top surface 106. The interface formed between upper portion 45 and lower surface 5, includes 90° bends.

FIG. 7A is an expanded cross-sectional view of a portion of FIG. 7. In the exemplary embodiment, tongue 49 includes ledge 107 which rests on top surface 105 of inner side 95 of sidewall 9. According to other exemplary embodiments, groove 21, sides 95 and 97 and tongue 49 may have other suitable cross-sectional shapes to enable groove 21 to retain gasket 101 and receive tongue 49. For example, sides 95 and 97 may be the same height. According to the various embodiments, groove 21 is a deep groove capable of retaining gasket 101 and receiving tongue 49.

Figure 8:
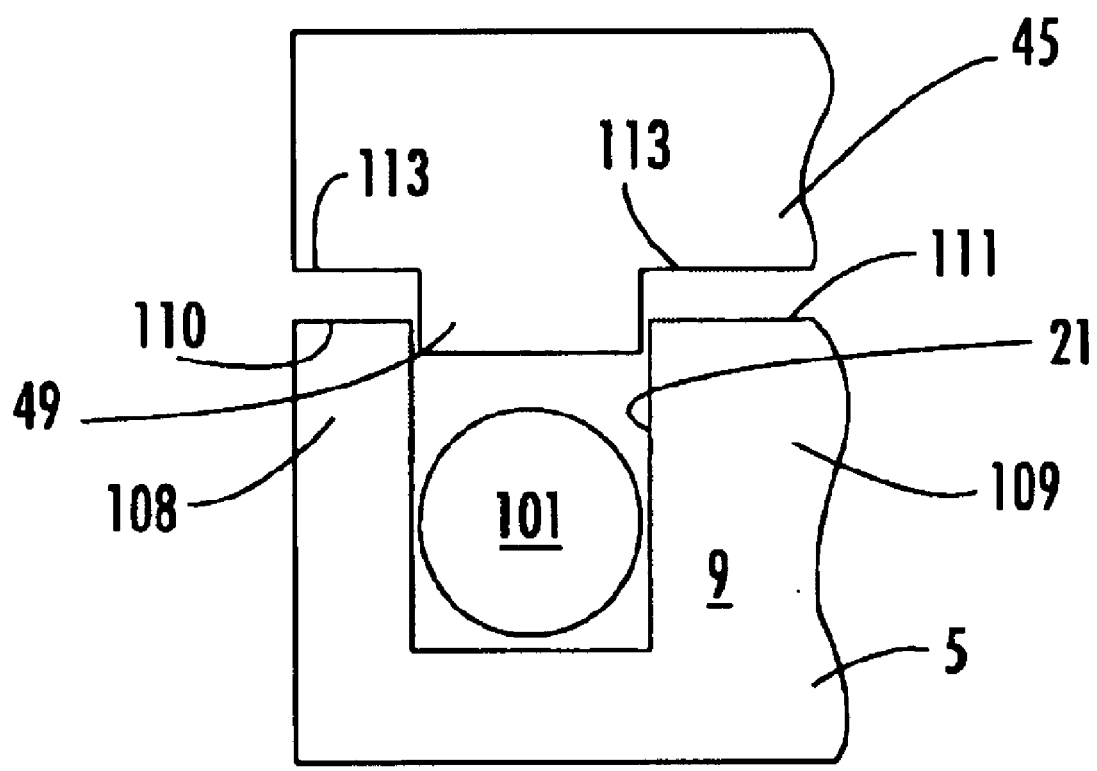
FIG. 8 is a cross-sectional view showing another exemplary embodiment of a peripheral engaging/locking feature of the present invention.

FIG. 8 is a cross-sectional view of another arrangement of an exemplary engaging/locking feature and shows the arrangement prior to the engagement of upper portion 45 and lower portion 5, and therefore prior to the compression of gasket 101. Sides 108 and 109 of sidewall 9 are the same height in the exemplary embodiment shown in FIG. 9. In this exemplary embodiment, each of inner and outer surfaces 113 of upper portion 45 forms a substantially conterminous boundary with corresponding top surfaces 110 and 111 of sides 108 and 109, respectively. When the portions are engaged and such a boundary is formed, tongue 49 compresses gasket 101 within groove 21. Compressed gasket 101 therefore contacts each of tongue 49 and the inner surfaces of groove 21.

Referring to the embodiments shown in FIGS. 7, 7A and 8, when upper portion 45 is engaged with lower portion 5 such that the mating surfaces are in contact, orthogonal tongue 49 extends into groove 21 and compresses gasket 101. Gasket 101 may have a circular cross-section when in a relaxed state but other gasket configurations may be used In other embodiments. The combination of top portion 45 including tongue 49, gasket 101 and lower portion 5, provides a shield against EMI radiation escaping from internal portions of the enclosure to external portions of the enclosure. In this embodiment, EMI radiation cannot easily escape through the orthogonal interface formed between the upper and lower portions in the exemplary embodiments. Even if the interface formed between 110 and 113, and 111 and 113 of FIG. 8 does not include a perfect seal, tongue 49 helps prevent EMI radiation from escaping because there is no crevice available to act as a slot antenna. The interface formed between the upper and lower portions is not a simple planar interface. The corners formed by orthogonal tongue 49 can cancel out EMI waves as they attempt to propagate through the interface formed by the engaging/locking feature. Since any high frequency signal or other forms of noise such as EMI radiation typically travels along the Interface formed between the upper and lower portions, the 90° bends provided by the engaging/locking feature of the present invention, cause the electromagnetic waves to induce charge on the surface of the conductive housing that provides an electromagnetic field which partially cancels the incident electromagnetic wave. When electromagnetic waves are forced to traverse corrugation such as the 90° bends produced, the electromagnetic waves are attenuated or completely destroyed and do not successfully traverse the interface.

Grounding Scheme

Figure 9:
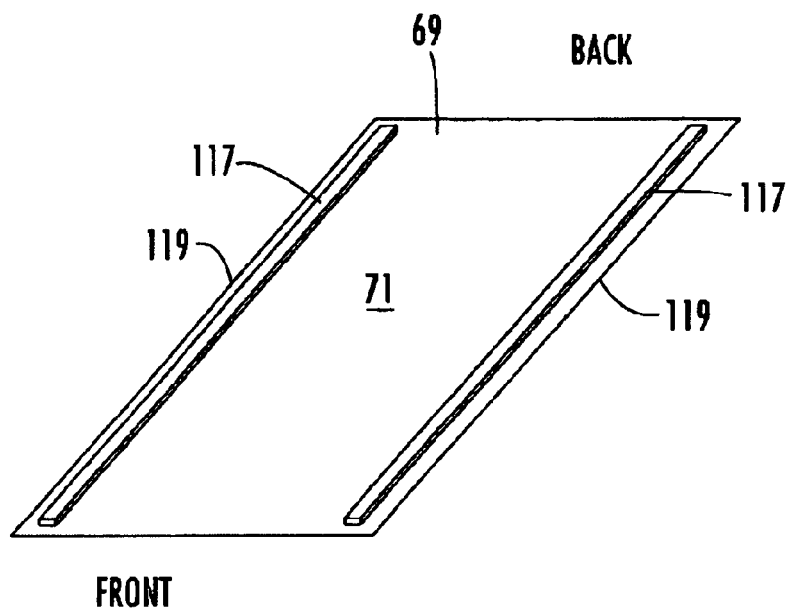
FIG. 9 is a perspective view showing exemplary grounding strips of an exemplary grounding scheme of the present invention.

According to another exemplary embodiment, the present invention provides a grounding scheme. The grounding scheme provides for grounding the conductive housing through the intended grounding path. Grounding leads are formed along either or both of the top and bottom surfaces of a printed circuit board such as printed circuit board 69 shown in FIG. 3. According to an exemplary embodiment, each of the top and bottom surface of the printed circuit board contains a set of grounding leads that are formed along the side edges and which generally extend from front to back according to the arbitrary spatial designations assigned in FIGS. 3 and 9. FIG. 9 shows printed circuit board 69 which includes a set of grounding leads 117 formed on top surface 71. Grounding leads 117 may be formed using conventional methods and may formed of lead or tin or other suitable conventional materials. Each grounding lead 117 may extend along or in close proximity to edge 119 and may also extend from the front to the back of printed circuit board 69. In the exemplary embodiment shown, each of grounding leads 117 forms a straight strip. This is exemplary only and according to other exemplary embodiments, the grounding leads may take on different shapes and be placed in different locations. In an exemplary embodiment, further grounding leads will also be formed on the bottom surface of printed circuit board 69. The grounding leads formed on the bottom surface of printed circuit board 69 may take on various configurations and in an exemplary embodiment they may be formed opposite the grounding leads formed on upper surface 71.

Figure 10:
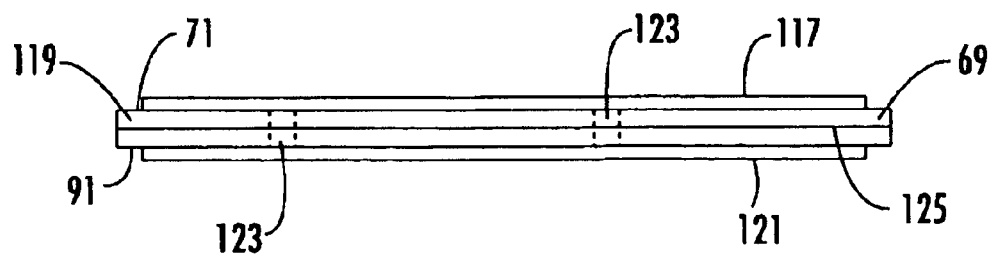
FIG. 10 is a side view of elements of the exemplary grounding scheme of the present invention.

FIG. 10 is a cross-sectional view showing grounding lead 117 formed on top surface 71 and grounding lead 121 formed opposite grounding lead 117 on bottom surface 91. The corresponding upper and lower grounding leads are electrically coupled through via 123. Via 123 also provides coupling to internal ground plate 125. According to other exemplary embodiments, printed circuit board 69 may include multiple grounding plates such as the singular internal grounding plate 125 illustrated in FIG. 10. According to another exemplary embodiment in which upper and lower grounding leads 117 and 121 respectively, are not formed opposite each other, multiple vias may be used to separately couple the respective grounding strips to the internal ground plate.

The housing may be formed of a conductive material and is designed so that when the upper and lower portions of the housing are engaged by clamping or other fastening means, each of the upper and lower portions of the housing are grounded to the grounding leads such as grounding leads 117 and 121 of printed circuit board 69. More specifically, each of the upper and lower portions of the housing include relief features that mechanically contact either the upper or lower grounding lead when the portions of the housing are engaged. For example, as shown in FIG. 1, ribs 17 and 19 of lower portion 5 may mechanically contact lower grounding lead 121 of printed circuit board 69 when the printed circuit board is inserted within the housing and the portions of the housing are engaged. Similarly, ribs 51 of upper portion 45 shown in FIG. 2 may mechanically contact upper grounding lead 117 shown in FIG. 9. The various ribs for providing mechanical contact as shown in FIGS. 1 and 2 are intended to be exemplary only. Various other relief features may be used to ensure that, when the upper and lower portions of the housing are engaged, mechanical contact is made between the grounding leads and the upper and lower portions of the housing.

The internal ground plate 125 integral to printed circuit board 69 is therefore electrically coupled or grounded to the grounding leads formed on the top and bottom of the printed circuit board as well as to directly to the upper and lower portions of the conductive housing. In this manner, errant signals travel through the conductive housing to the internal ground plate which directs errant signals along an intended grounding path which may be external to the housing.

Corrugated Channel for Improving Sealing and EMI Shielding Performance

According to another exemplary embodiment, the present invention provides a channel having a cross-sectional area that varies along the longitudinal direction of the channel. The corrugated channel is configured to receive a gasket and to provide for a uniform seal between the facing sealing surfaces of the multiple portions that combine to form the housing of the present invention. The cross-sectional area of the corrugated channel may vary intermittently along regular or irregular intervals. The varying cross-sectional area may include a plurality of minimum cross-sectional area portions for tightly securing a gasket having a constant cross-sectional area chosen to fit snugly within the minimum cross-sectional area portions of the channel. By retaining a gasket having a constant cross-sectional area within the irregular channel, the gasket in this embodiment achieves added compression only at "pinch points" (points of minimum cross-sectional area), and therefore an increase in contact pressure can be used to secure the upper portion of the housing without fear of bunching the gasket and forming gaps between the facing sealing surfaces at locations between fastening points, as a result. According to the embodiment in which an upper portion and lower portion combine to form a two-piece housing, the lower portion may include the corrugated channel and gasket. According to other exemplary embodiments, the corrugated channel may be included in the upper portion of the housing or it may be included in each of the upper and lower portions. According to other multiple-piece housing embodiments, any or all of the portions may include the corrugated channel and gasket.

FIGS. 11 and 12 are perspective views showing irregular channel 131 formed within sidewall 9 of lower portion 5. Irregular channel 131 extends downward from upper sealing surface 133 and within sidewall 9. Lower portion 5 will be joined to an associated upper portion (not shown) to form the multiple-piece housing of this embodiment of the present invention. When joined, upper sealing surface 133 will advantageously contact a facing sealing surface of the upper portion.

When a gasket (not shown) having a substantially constant cross-sectional area is placed within irregular channel 131 formed within upper sealing surface 133 of lower portion 5, and a cover in the form of an upper portion is positioned into place over lower portion 5, the varying cross-sectional area of corrugated channel 131 allows for an increased pressure to be applied to join the portions together to form the housing. Regularly spaced fastening means such as screws, may be used to join the portions together to form the housing after a gasket is placed within irregular channel 131. Irregular channel 131 and the gasket allow for a tight and uniform seal to be formed between the opposed sealing surfaces. The design of the irregular channel of the present invention provides for maximum compression of the gasket only at the pinch points, and therefore prevents the gasket seated within the irregular channel from bunching and preventing facing sealing surfaces of the upper and lower portions from forming a conterminous boundary at such bunching locations between the fastening members. According to sealing methods of prior art, a space could result between the intended sealing surfaces and of the upper and lower portions due to springing or flexing of the housing in locations between the fastening members. The present arrangement prevents springing or flexing of the housing portions. The openings produced by springing or flexing of the housing portions of the prior art, reduce the housing shielding effectiveness by allowing for the transmission of EMI or RFI noise into or out of the housing. Screws, clamps or other fastening means may be used to join the upper and lower portions at the fastening points.

Exemplary rounded projections 135 extend into irregular channel 131 to vary the cross-sectional area of irregular channel 131 along the longitudinal direction. Although shown as rounded projections 135 that extend into irregular channel 131 in each of FIGS. 11 and 12, various other configurations for producing a channel having an intermittently varying cross-sectional area along its longitudinal direction may be used. Furthermore, the indentations that project into irregular channel 131 need not be formed at opposed locations and across from each other within the channel. In an exemplary embodiment, irregular channel 131 includes regularly repeating minimal cross-sectional area portions.

Figure 13A:
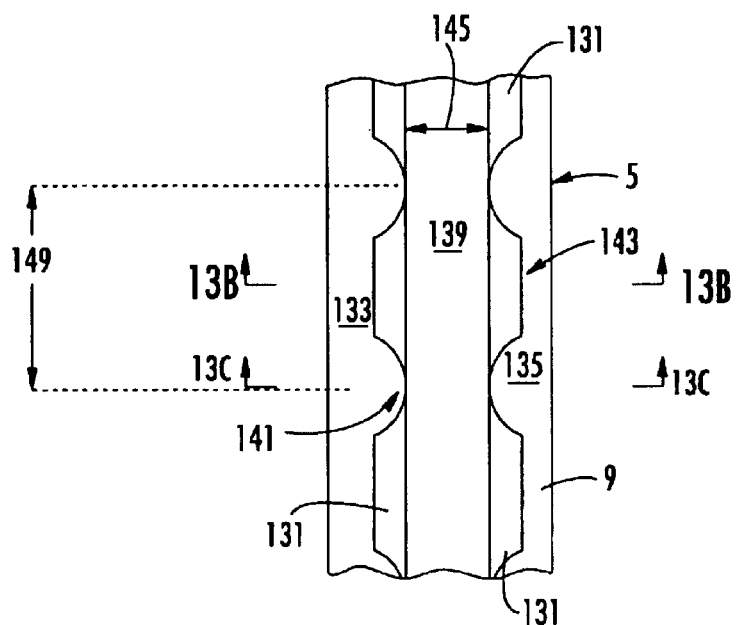
FIG. 13A is a plan view of an exemplary corrugated channel of the present invention.

FIG. 13A is a top view of the irregular channel. Corrugated or irregular channel 131 includes narrow sections 141 and wide sections 143. Irregular channel 131 extends downward from upper sealing surface 133. Gasket 139 is included within irregular channel 131. Gasket 139 includes a generally constant cross-sectional area indicated by diameter 145 according to the embodiment in which gasket 139 is round. A cross-sectional view taken along line 13B—13B of wide section 143 is shown in FIG. 13B.

Figure 13B:
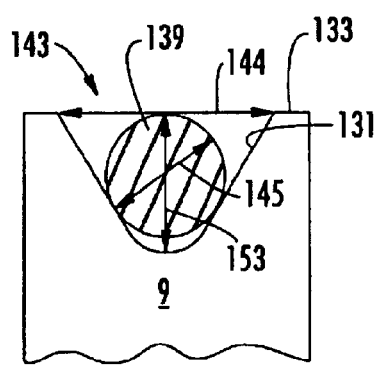
FIG. 13B is a cross-sectional view of a wide portion of the corrugated channel of the present invention.

In FIG. 13B it can be seen that gasket 139 is not tightly seated within wide section 143 of irregular channel 131. Wide section 143 is so designated because width 144 at the top of wide section 143 and depth 153 of wide section 143 provide a greater cross-sectional area than the corresponding dimensions in narrow section 141. Gasket 139 is in a non-fully compressed state in wide section 143. In an exemplary embodiment, gasket 139 may be minimally compressed when an opposed, generally flat sealing surface mates with upper sealing surface 133. Gasket 139 includes an essentially constant cross-sectional area and diameter 145. Gasket 139 may be formed of conventional compressible materials such as commercially available elastomers and may be either impregnated, coated, or otherwise encased in an electrically conductive material. Gasket 139 may be a solid gasket such as shown in the exemplary embodiments shown in FIGS. 14B and 13C, or it may include a hollow core.

Figure 13C:
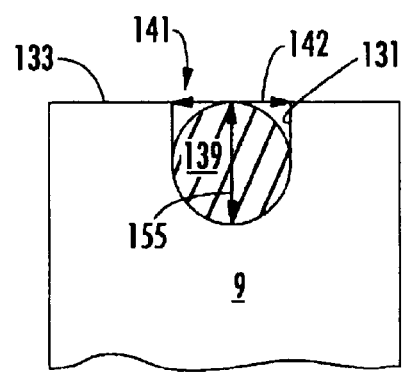
FIG. 13C is another exemplary cross-sectional view of a narrow portion of the corrugated channel of the present invention.

FIG. 13C is a cross-sectional view taken along line 13C—13C of narrow section 141 shown in FIG. 14A. Narrow section 141 is produced at locations in which opposed rounded projections 135 are formed in irregular channel 131. Narrow section 141 includes width 142 along upper sealing surface 133 and depth 155. Width 142 and depth 155 of narrow section 141 are chosen in this embodiment, so that the cross-sectional area of narrow section 141 is less than that of wide section 143. FIG. 13C shows that gasket 139 is essentially tightly sealed within corrugated channel 131 at narrow section 141. In this embodiment, narrow section 141 may be considered a pinch point for gasket 139 and represents the minimal cross-sectional area of the corrugated channel 131 and the maximum compression points of gasket 139, when an opposed generally flat sealing surface is brought into contact with upper sealing surface 133.

Figure 14:
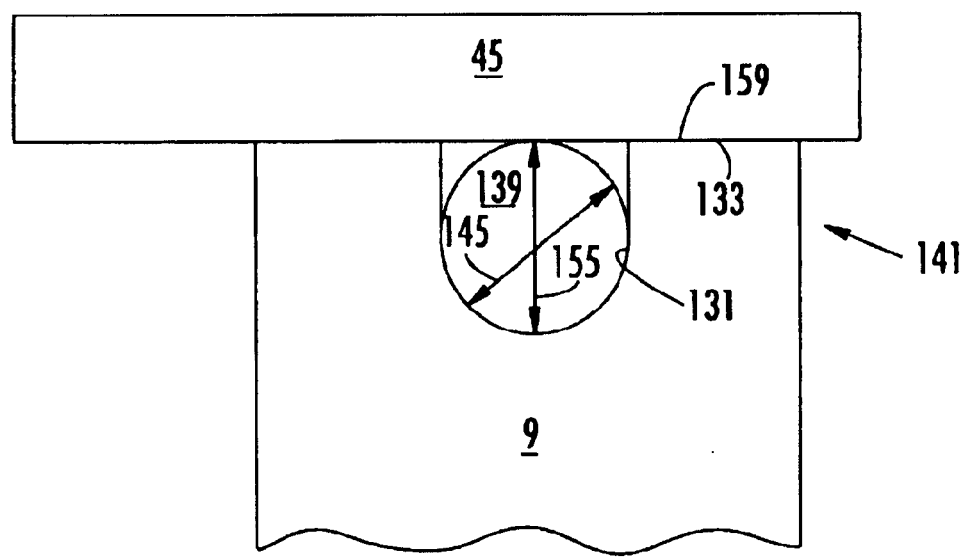
FIG. 14 is a cross-sectional view showing a gasket within an engagement feature including the corrugated channel of the present invention.

FIG. 14 is a cross-sectional view showing narrow section 141 of irregular channel 131. Gasket 139 is compressed at the pinch point represented by narrow section 141. Upper portion 45 includes sealing surface 159 which forms an interface with upper sealing surface 133 and also contacts gasket 139. Depth 155 and diameter 145 of gasket 139 are substantially similar.

According to the exemplary embodiment in which the intermittently varying cross-sectional area of irregular channel 131 does so in regular intervals, distance 149 (FIG. 13A) between regularly spaced narrow sections 141, may be considered the pitch and may be the wavelength of the maximum desired shielding frequency, divided by ten, in an exemplary embodiment. According to an exemplary embodiment, the irregular channel feature of the present invention may be used in conjunction with the tongue/groove engaging/locking feature of the present invention as described in conjunction with FIGS. 7, 7A and 8. In other words, in this embodiment, irregular channel 131 may include pinch points of reduced cross-sectional area and be designed to accommodate a gasket of substantially constant cross-sectional area and a tongue from the opposed mating surface to aid in compressing the gasket at pinch points. According to this exemplary embodiment, irregular channel 131 may extend down from sides of unequal height such as shown in FIG. 7.

EMI Suppression Within Mounted Housing

Figure 15:
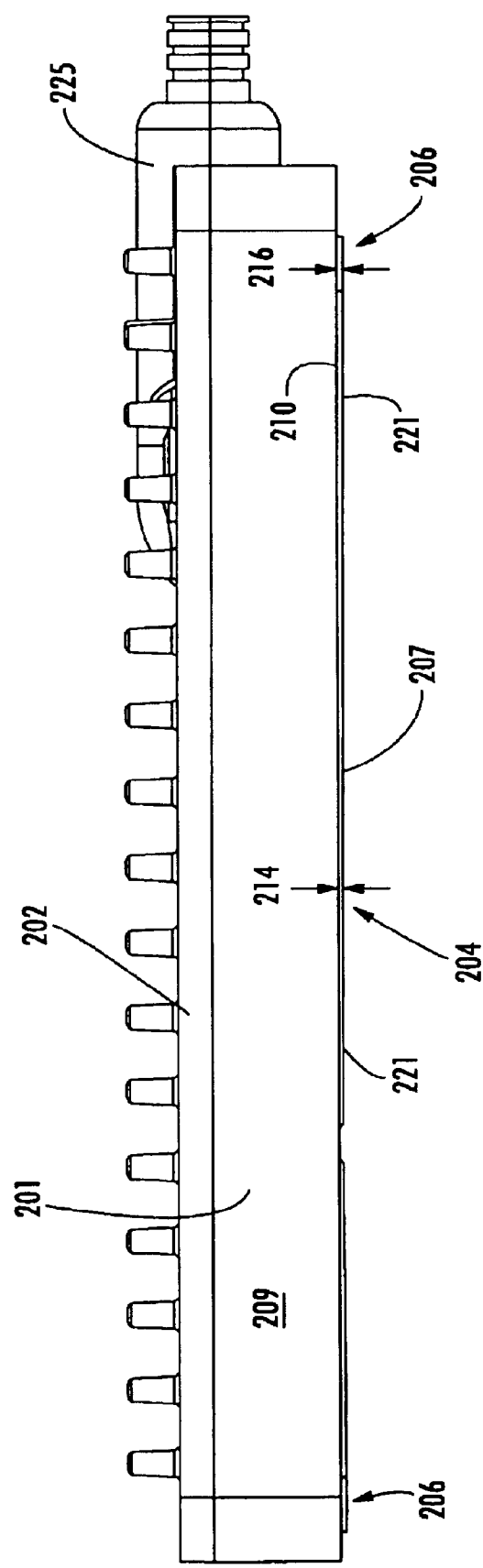
FIG. 15 is a side view of an exemplary optoelectronic housing of the present invention.

FIG. 15 is a side view of housing 200 including bottom portion 201 and upper portion 202. Housing 200 includes arm 225 formed of portions of each of bottom portion 201 and upper portion 202. Lower portion 201 includes sidewalls 209 and bottom 207. Bottom 207 is adapted to be mounted on or over a mounting surface such as a customer board or other mother board. Bottom 207 includes a recessed portion being recessed above lowermost surface 221 of bottom 207. Housing 200 includes connector sites 206 at which connectors such as machine screws or other fasteners may be used to join housing 200 to the mounting surface. As shown in the side view, a gap is created between upper surface 210 of the recessed portion and lowermost surface 221 of bottom 207. Gap 216 formed at connector sites 206 is greater than gap 214 formed at intermediate locations 204 between the connector sites.

Figure 16:
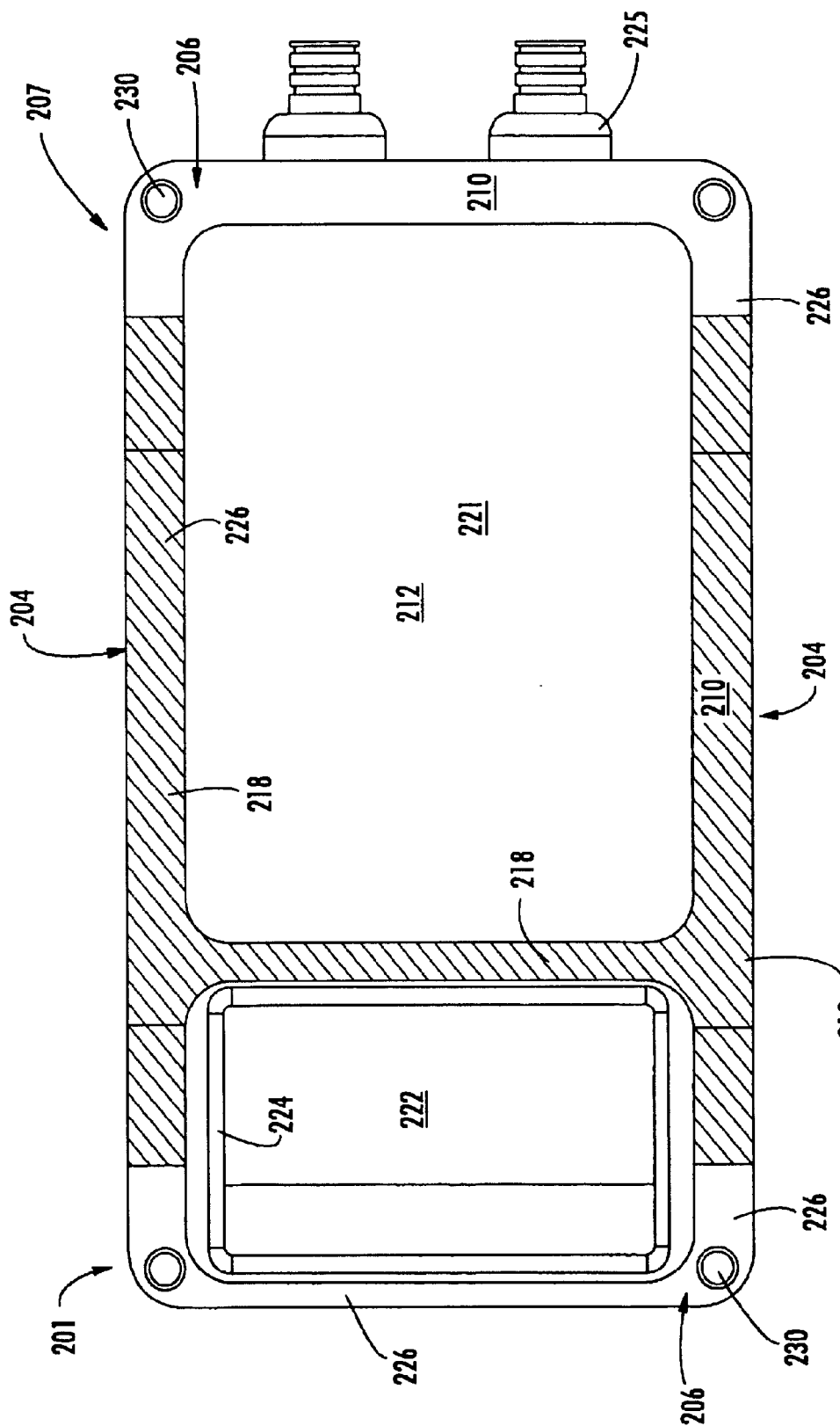
FIG. 16 is a plan view of the bottom of an exemplary optoelectronic housing of the present invention.

FIG. 16 is a plan view showing bottom 207 of lower portion 201. Bottom 207 includes centrally located base portion 212 that includes lowermost surface 221. In an exemplary embodiment, lowermost surface 221 is essentially planar. In the exemplary embodiment shown, recessed portion 226 extends peripherally around bottom 207 and also between base portion 212 and opening 222. Recessed portion 226 may take on various other shapes and is shaped to accommodate a gasket therein. Recessed portion 226 includes upper surface 210. Recessed portion 226 includes openings 230 which may be connector openings in the exemplary embodiment. Connector openings 230 are located at connector sites 206. Locations 204 are located between connector sites 206. In an exemplary embodiment, connector opening 230 may be an opening through which a fastener such as a machine screw may be inserted to secure bottom surface 207 of lower portion 201 onto a mounting surface. As shown in the side view of FIG. 15, lowermost surface 221 of base portion 212 extends below upper surface 210 of recessed portion 226. The gap between upper surface 210 and lowermost surface 221 is greater at connector sites 206 than at locations such as location 204 between connector sites 206. This is achieved because upper surface 210 of recessed portion 226 is bowed downward as shown in FIG. 15. In the exemplary embodiment shown in FIG. 16, the cross-hatched area may represent bowed area 218. According to other exemplary embodiments, the contour of recessed portion 226 may be varied and bowed section 218 may be a larger or smaller portion of recessed portion 226 in order to provide that the gap formed between upper surface 210 and lowermost surface 221 is greater at connector sites 206 than at locations 204 between connector sites 206. In this manner, when a gasket of constant thickness is placed within recessed portion 226, a greater compressive force will desirably be achieved within the gasket at locations 204 than at connector sites 206. According to another exemplary embodiment, the compressive force within the gasket is constant throughout. Without the variation in the gap, and according to the prior art, the gasket may not be in compression throughout and the seal formed at locations 204 between connector points 206, may not be a tight seal enabling propagation of EMI and RFI waves. According to other exemplary embodiments, any of various numbers of connectors and connector sites may be used, as an alternative to the four exemplary sites shown in FIG. 16.

Figure 17:
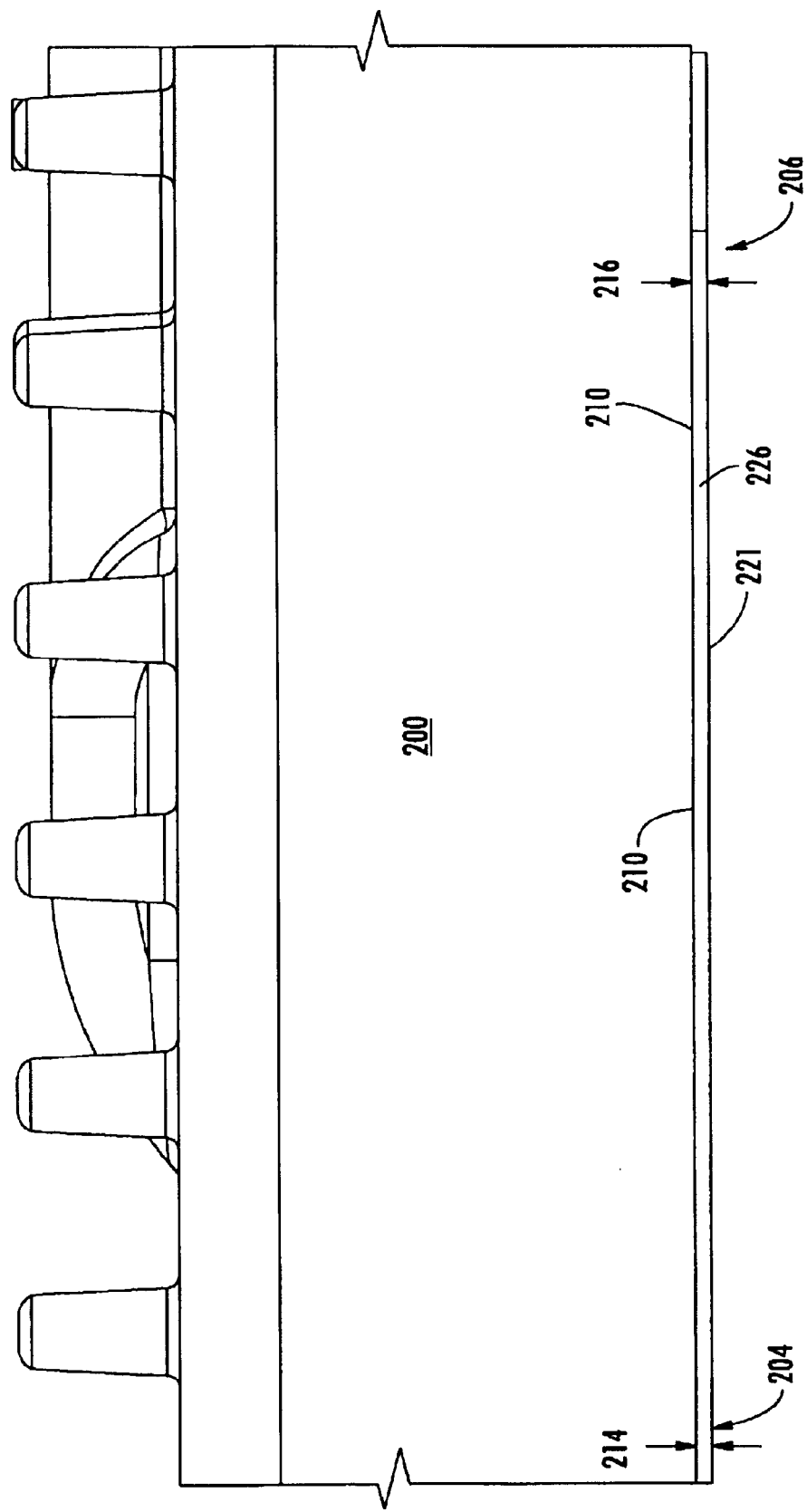
FIG. 17 is an expanded side view of the optoelectronic housing of the present invention showing a recessed portion on the bottom of the housing.

FIG. 17 is an expanded side view of housing 200 and shows gap 216 at connector site 206 and gap 214 at location 204 between connector sites 206. Lowermost surface 221 is essentially planar in the exemplary embodiment. Upper surface 210 of recessed portion 226 is not planar and therefore gap 214 is less than gap 216. In an exemplary embodiment, gap 216 may be $25/1000$ inch and gap 214 may be $18-20/1000$ inch. This provides a gap variation of $5-7/1000$ inch throughout recessed portion 226. Such are intended to be exemplary only and other gap thicknesses and variations may be used in other exemplary embodiments.

Figure 18:
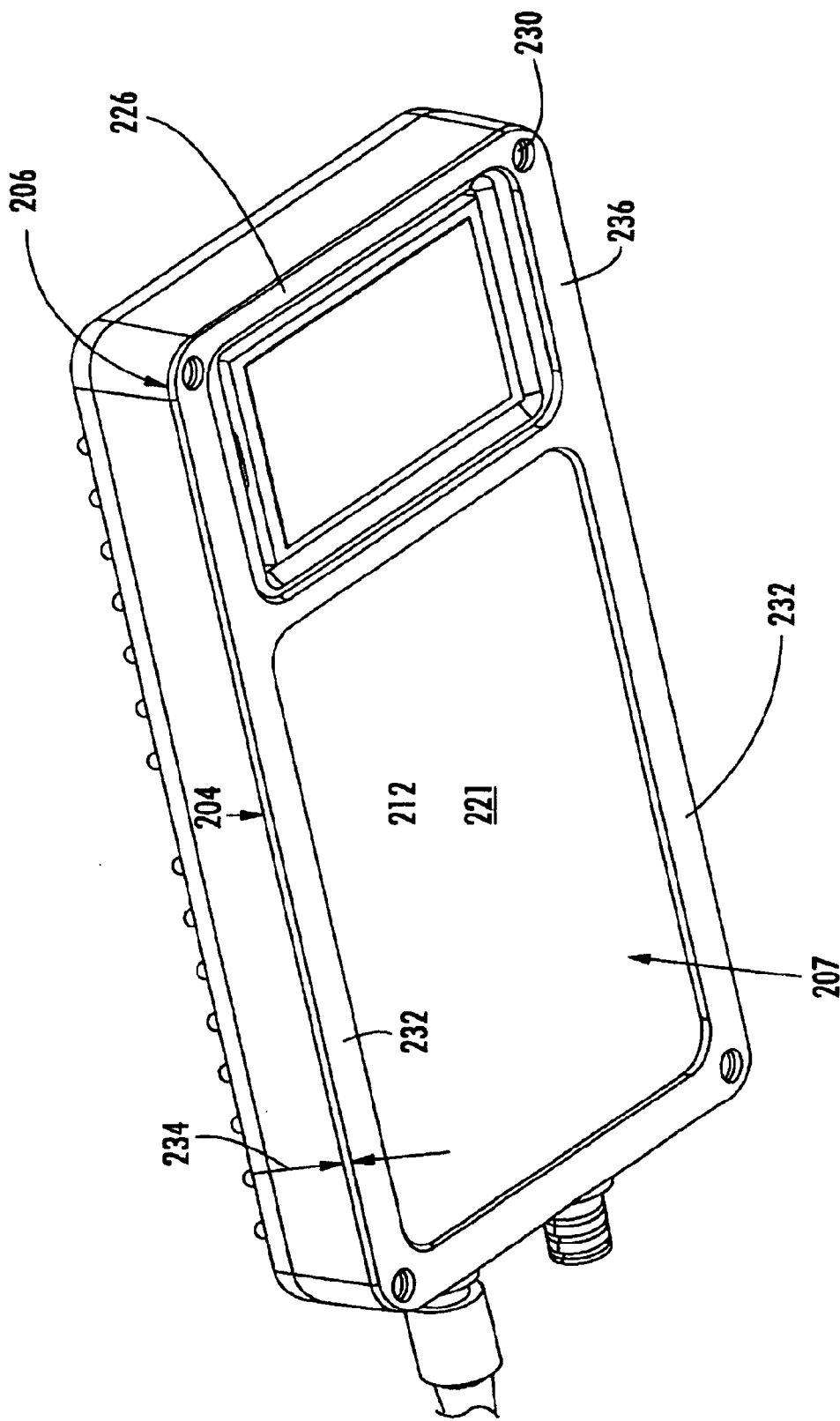
FIG. 18 is a perspective view showing the bottom of an exemplary optoelectronic housing including a sealing gasket.

FIG. 18 is a perspective view showing bottom 207 of housing 200. FIG. 18 shows gasket 232 seated within recessed portion 226. Gasket 232 includes thickness 234 which may be a constant thickness according to a exemplary embodiment. Thickness 234 is chosen so that gasket 234 extends below lowermost surface 221 of base portion 212 when seated within recessed portion 226. In this manner, lower surface 236 will form an interface with the mounting surface on which housing 200 is mounted. When machine screws or other fastening means are provided within connector openings 230 to secure housing 200 to a mounting surface, the compression of gasket 232 will desirably be greater at locations 204 than at connector sites 206 due to the bowed upper surface of the recessed portion 226. According to an exemplary embodiment, thickness 234 may be $32/1000$ inch and the gasket 232 may undergo a compression of $7/1000$ inch at connector sites 206 and a compression of $12-13/1000$ inch at locations 204 between connector sites 206. Such thicknesses and degrees of compression are exemplary only and gasket 234 may be formed of various thicknesses and may achieve different degrees of compression at connector sites 206 and locations 204.

The configurations shown in FIGS. 16–18 are intended to be exemplary only and the recessed portion may take on other shapes with respect to the base section above which it is recessed. For example, base section 212 may take on various shapes and positions other than centrally positioned base portion 212. Generally described, the recessed portion extends above the base section and includes a lower surface that is higher than the surface of the base section and is spaced above the base section by a first distance at connector sites and by a second distance at other sites, the second distance being less than the first distance to desirably ensure at least as much gasket compression between the connector sites as at the connector sites.

Self Alignment Feature

Figure 19:
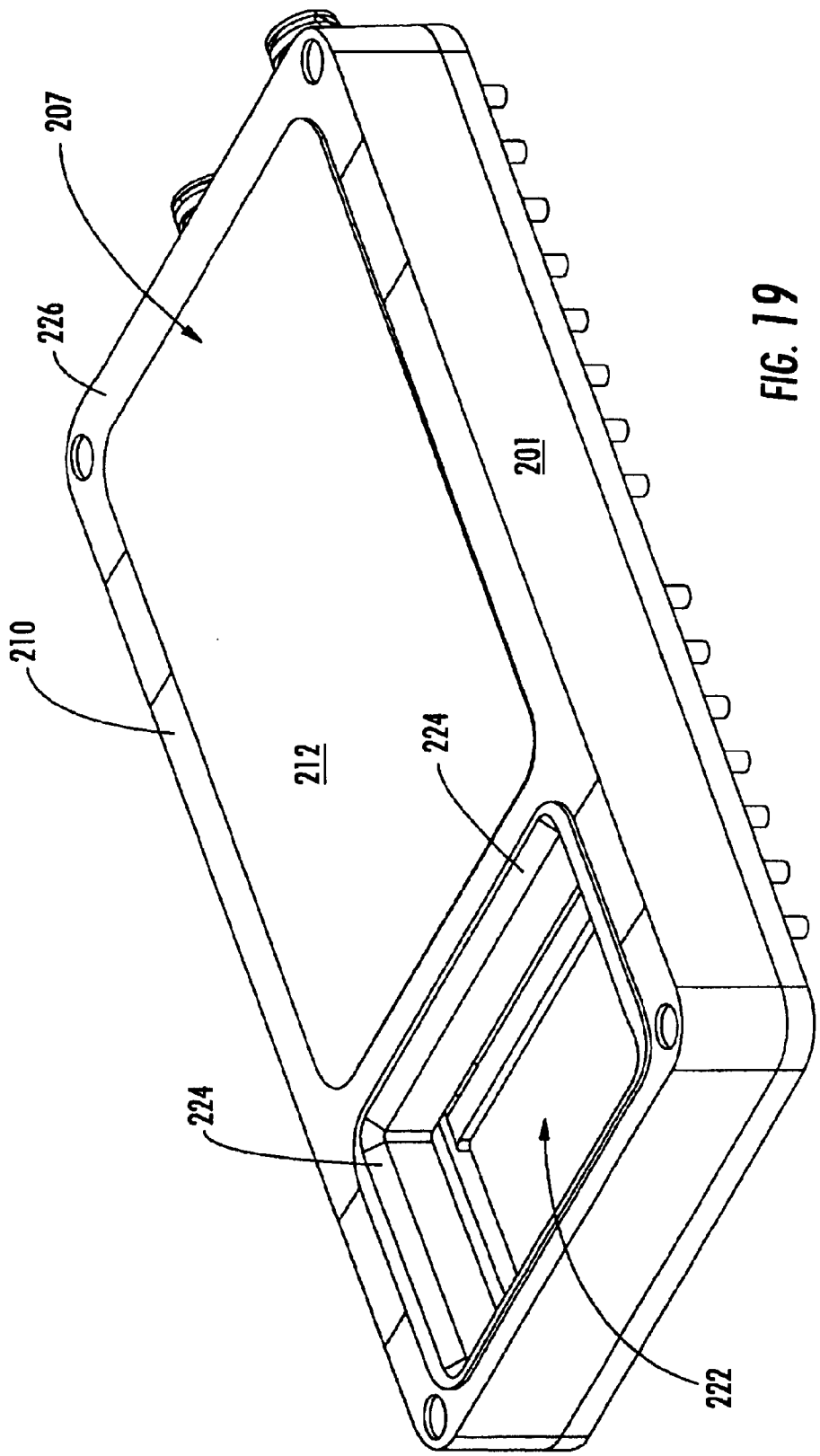
FIG. 19 is a perspective view of the bottom of an exemplary optoelectronic housing according to the present invention including an opening surrounded by beveled edges.

FIG. 19 is another perspective view showing bottom 207 of lower portion 201 of housing 200. Opening 222 extends through bottom 207 and is bounded by a beveled edge 224. According to an exemplary embodiment, housing 200 is formed of an opaque material. The opaque materials may be various conductive materials and their alloys as described above. When housing 200 is mounted on a mounting surface, housing 200 may be positioned so that components on the mounting surface which are to be received and nested within opening 222 are not damaged by bottom 207 of housing 200 when attempting to align the housing into position using manual or other tactile alignment methods. In an exemplary embodiment, housing 200 may house components that convert and condition an optical/electrical signal that is presented to the housing through a connector interface such as through components on the mounting surface which are received within opening 222. Since housing 200 is opaque, a blind alignment of the housing, in particular opening 222 over the components, is carried out. Without being able to see opening 222 relative to the components which it may desirably surround, beveled edge 224 provides for aligning housing 200 over the components through tactile feedback or feel for the mating connector. Beveled edge 224 assists in aligning housing 200 over the components without damaging the components. When the housing is mounted on the mounting surface and positioned over the components, the components are tightly nested and extend within opening 222.

The preceding merely illustrates the principles of the invention. It will thus be appreciated that those skilled in the art will be able to devise various arrangements which, although not explicitly described or shown herein, embody the principles of the invention and are included within its scope and spirit. Furthermore, all examples and conditional language recited herein are principally intended expressly to be only for pedagogical purposes and to aid in understanding the principles of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and the functional equivalents thereof. Additionally, it is intended that such equivalents include both currently known equivalents and equivalents developed in the future, i.e., any elements developed that perform the same function, regardless of structure. The scope of the present invention, therefore, is not intended to be limited to the exemplary embodiments shown and described herein. Rather, the scope and spirit of the present invention is embodied by the appended claims.

What is claimed is:

1. An arrangement feature for a multiple piece optoelectronic device housing having a first piece and second piece, said engagement feature comprising a tongue, a groove and a gasket, said tongue extending from said first piece of said optoelectronic device housing and having a generally rectangular cross-section, said second piece of said optoelectronic device housing including a bottom wall and sidewalls extending above said bottom wall, and said groove extending downwardly within a sidewall of said second piece and having a generally rectangular cross-section, capable of refining said gasket therein and capable of receiving said tongue therein, such that said tongue extends into said groove and said gasket contacts said tongue and surfaces of said groove, when said first piece and said second piece are engaged.

2. The engagement feature as in claim 1, further comprising said first piece coupled to said second piece such that said gasket is in compression.

3. The engagement feature as in claim 1, in which said first piece is a cover and said tongue extends from a cover surface of said cover, and said first piece and said second piece are joined such that said tongue is received within said groove.

4. The engagement feature as in claim 1, in which said tongue extends completely and peripherally about said first piece.

5. The engagement feature as in claim 1, in which said groove extends downward within said sidewall from a set of opposed upper surfaces having different heights and said tongue includes a shoulder which rest on one of said opposed upper surfaces, when said first piece and said second piece are engaged.

6. The engagement feature as in claim 1, in which said gasket is formed of an elastomer and is one of impregnated with, coated with, and encased by, an electrically conductive material.

7. The engagement feature as in claim 1, in which said first piece and said second piece are engaged to form an interface therebetween, said interface including orthogonal turns.

* * * * *